United States Patent [19]

Uchida

[11] Patent Number: 4,723,155
[45] Date of Patent: Feb. 2, 1988

[54] SEMICONDUCTOR DEVICE HAVING A PROGRAMMABLE FUSE ELEMENT

[75] Inventor: Yukimasa Uchida, Yokohama, Japan

[73] Assignee: Tokyo Shibaura Denki Kabushiki Kaisha, Kawasaki, Japan

[21] Appl. No.: 910,850

[22] Filed: Sep. 24, 1986

Related U.S. Application Data

[63] Continuation of Ser. No. 721,134, Apr. 8, 1985, abandoned, which is a continuation of Ser. No. 423,299, Sep. 24, 1982, abandoned.

[30] Foreign Application Priority Data

Oct. 9, 1981 [JP] Japan ................... 56-161336
Oct. 9, 1981 [JP] Japan ................... 56-161337

[51] Int. Cl.$^4$ ............................................. H01L 23/48
[52] U.S. Cl. ................................ 357/51; 357/23.11; 357/52; 357/68; 357/23.5
[58] Field of Search ............... 357/23.11, 51, 52, 68, 357/41, 42, 52 D, 23.5

[56] References Cited

U.S. PATENT DOCUMENTS

| | | | |
|---|---|---|---|
| 3,699,395 | 10/1972 | Boleky | 357/68 X |
| 3,792,319 | 2/1974 | Tsang | 357/23.5 X |
| 3,955,210 | 5/1976 | Bhatia et al. | 357/42 |
| 4,006,491 | 2/1977 | Alaspa et al. | 357/23.11 |
| 4,045,310 | 8/1977 | Jones et al. | 357/41 X |
| 4,064,493 | 12/1977 | Davis | 365/96 |
| 4,223,334 | 9/1980 | Gasner et al. | 357/42 |
| 4,238,839 | 12/1980 | Redfern et al. | 357/23.5 X |
| 4,320,409 | 3/1982 | Shoji | 357/42 |
| 4,442,529 | 4/1984 | Ahuja et al. | 357/34 |

OTHER PUBLICATIONS

Abbott et al., "Equipping a Line of Memories with Spare Cells", *Electronics*, Jul. 28, 1981, pp. 127–130.

May et al., "High-Speed Static Programmable Logic Array in LOCMOS", *IEEE Journal of Solid-State Circuits*, vol. SC-11, No. 3, Jun. 1976, pp. 365–368.

*Primary Examiner*—Andrew J. James
*Assistant Examiner*—William A. Mintel
*Attorney, Agent, or Firm*—Finnegan, Henderson, Farabow, Garrett & Dunner

[57] ABSTRACT

A fuse element is formed on a field insulation film on a semiconductor substrate of n conductivity type in which MOS transistors are formed. A first guard ring region of second conductivity type is provided in the substrate, surrounding the semiconductor substrate region under the fuse element. A second guard ring region of first conductivity type is formed in the substrate, surrounding the first guard ring region. Proper potentials are applied to the first and second guard ring regions.

9 Claims, 9 Drawing Figures

SEMICONDUCTOR DEVICE HAVING A PROGRAMMABLE FUSE ELEMENT

This application is a continuation of application Ser. No. 721,134, filed 4/8/85, abandoned, which is a continuation of application Ser. No. 423,299, filed Sept. 24, 1982, and now abandoned.

BACKGROUND OF THE INVENTION

The present invention relates to a semiconductor device including a programmable read only memory (PROM) and, more particularly, to a semiconductor device including a PROM fuse element.

A memory array in a metal oxide semiconductor large scale integrated circuit (MOS LSI) memory device has spare rows and spare columns. If a row or column has a failure, then the defective row or column can be replaced by a spare row or column. For this replacement, PROM elements of fuse type (referred to as fuse elements) are provided in the memory device, and the replacement is made by melting or shortcircuiting the fuse element.

There are several known methods for programming the fuse element including: a current melting method for melting away the fuse by directing excessive current through it, a laser cutting method for cutting the fuse element by laser beams, a current shortcircuiting method for shrotcircuiting the fuse by directing current into the fuse, and a laser shortcircuiting method for shortcircuiting the fuse by laser beams. As shown in FIG. 1, a fuse element 1 can be formed on a field insulation film 3 layered on the semiconductor substrate 2 of an n-type device. A MOS LSI with such a fuse element 1 has the following disadvantages, however. The fuse element 1 is frequently programmed by melting away, cutting off or shortcircuiting the fuse element. At the time of the programming operation, heat is generated near the fuse element 1. Electrons e or holes h, which are part of paired carriers generated in the semiconductor substrate by the heat, are diffused along the substrate 2 so as to disturb the operation of an MOS LSI formed in the substrate near the fuse element 1. Particularly, in the current melting method or the current shortcircuiting method, when an MOS type drive circuit is used for programming the fuse element, the programming is inaccurately performed. To avoid this problem, the MOS type drive circuit must be sufficiently spaced from the fuse element 1.

Thus, fuse element 1, provided in the prior art, hinders improvement in integration density of the MOS LSI.

Another disadvantage with the prior art fuse element is that, due to the heat generated at the time of melting or shortcircuiting the fuse element 1, a large number of contaminant ions are generated on or in the field insulation film near the fuse element 1. The contaminant ions are, for example, alkali ions containing sodium ions and potassium ions or metal ions containing copper ions. Such contaminant ions move on or in the field insulation film 3 to form stray MOS transistors between the sources and drains of the MOS transistors formed in the substrate 2, and between the diffusion interconnection layers. The stray MOS transistors significantly deteriorate the reliability of the MOS LSI. To prevent this, the MOS LSI must be formed sufficiently separated from the fuse element. This also hinders improvements in integration density of the MOS LSI. To date, there has not been proposed a semiconductor device having means for solving the above-mentioned problems to a satisfactory degree.

SUMMARY OF THE INVENTION

Accordingly, an object of the present invention is to provide a semiconductor device with a fuse element in which the fuse element may reliably be programmed and the reliability of the semiconductor device is not reduced by the contaminant ions generated following the programming operation of the fuse element.

According to one aspect of the present invention, there is provided a semiconductor device comprising a semiconductor substrate of first conductivity type in which metal oxide semiconductor transistors are formed; a fuse element formed on a field insulation film provided on the semiconductor substrate; a first guard ring region formed in the substrate so as to surround that region of the semiconductor substrate which is under the fuse element; and a second semiconductor guard ring region formed in the substrate so as to surround the first semiconductor guard region. The first and second semiconductor guard ring regions are different from each other in conductivity type.

According to another aspect of the present invention, there is provided a semiconductor device comprising a semiconductor substrate of first conductivity type in which metal oxide semiconductor transistors are formed; a fuse element formed on a field insulation film provided on the semiconductor substrate; and a semiconductor well region of second conductivity type formed in that region of the semiconductor substrate which is under the fuse element.

DETAILED DESCRIPTION OF THE PREFERRED EMBODIMENTS

Figure 2A:
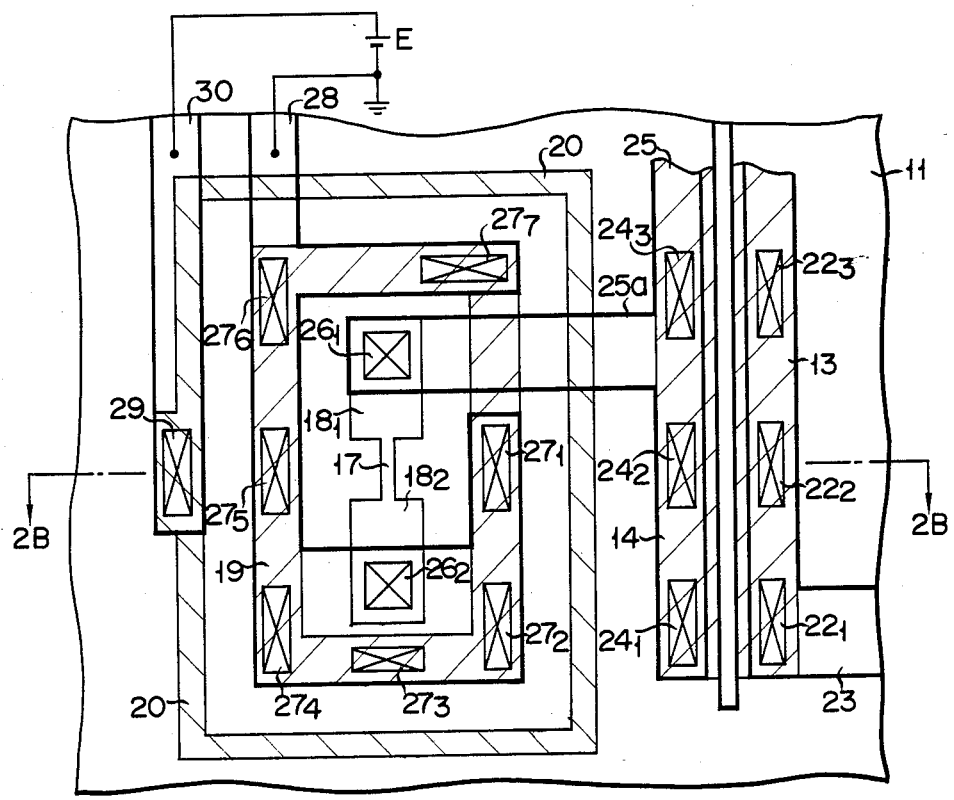
FIG. 2A shows a plan pattern view of a part of an embodiment of a semiconductor device with a fuse element according to the present invention, which illustrates relative locations of key parts of the semiconductor device.
Figure 2B:
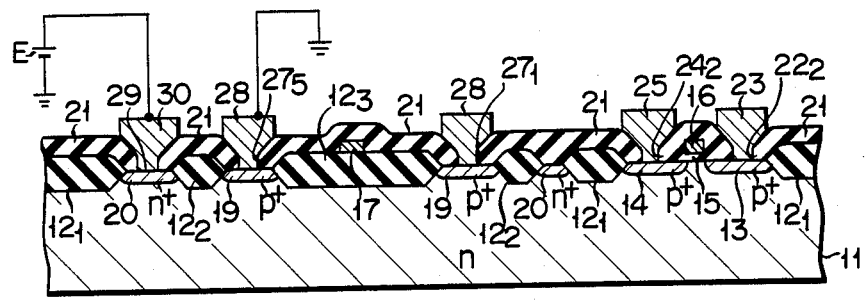
FIG. 2B shows a cross sectional view taken on line 2B—2B in FIG. 2A.

Turning now to FIG. 2A, a plan pattern of a semiconductor device with a fuse element is illustrated according to an embodiment of the present invention. The plan pattern illustrates relative locations of semiconductor regions, electrodes, contact holes and a fuse element. In FIGS. 2A and 2B, an n type substrate 11 is doped with a donor impurity, such as phosphorus, arsenic or antimony, at $10^{15}$ cm$^{-3}$. Field insulation films $12_1$, $12_2$ and $12_3$ made of silicon oxide of 8000 Å, for example, are formed on the surface of the substrate 11. The three field insulation films $12_1$ are interconnected and the two field insulation films $12_2$ are interconnected. The field insulation film $12_3$ is like an island. A p+ type source region 13 and a p+ type drain region 14, which are electrically separated from each other are formed on the surface of an island-like substrate region surrounded by the field insulation films $12_1$ and $12_1$. A gate electrode 16 of polycrystalline silicon of 5000 Å thickness and 15 ohms-cm of sheet resistance is formed on the substrate region between the source region 13 and the drain region 14, through a gate insulation film 15 of silicon oxide of 500 Å thickness. The source region 13, the drain region 14, the gate insulation film 15 and the gate electrode 16 make up a p channel MOS transistor. A fuse element of polycrystalline silicon with 2 μm in width and 6 μm in length, for example, is formed on the island-like field insulation film $12_3$. The fuse element 17 is coupled at both ends with polycrystalline silicon layers $18_1$ and $18_2$ wider than the fuse element 17. A first semiconductor guard ring region 19 of p+ type is formed on the ring substrate between the island-like field insulation film $12_3$ and the ring field insulation film $12_2$. In other words, the first guard ring region 19 surrounds the fuse element 17 provided on the field insulation film $12_3$. The first guard ring region of p+ type contains boron at approximately $10^{20}$ cm$^{-3}$ and the depth of the boron diffusion is 0.5 μm. A second semiconductor guard ring region 20 of n+ type is formed on the surface of the ring substrate region between the field insulation film $12_2$ and the ring field insulation film $12_1$. The second guard ring region 20 contains a donor impurity of approximately $10^{20}$ cm$^{-3}$ such as phosphorus, arsenic or antimony. The donor impurity diffusion depth is 0.5 μm. An inter-insulation layer 21 of CVD (chemical vapor deposited) —SiO$_2$ is layered over the entire surface of the substrate 11 containing the gate electrode 16 and the fuse element 17.

An aluminium interconnection layer 23 for taking out the source by contacting with the p+ type source region 13 through contact holes $22_1$, $22_2$, $22_3$ which are provided through the inter-insulation layer 21, is formed on the inter-insulation layer 21. An aluminium interconnection layer 25 for taking out the drain by contacting with the p+ type drain region 14 through contact holes $24_1$, $24_2$, $24_3$ which are provided through the inter-insulation layer 21 is formed on the inter-insulation layer 21. The aluminium interconnection layer 25 is connected to a branch aluminium interconnection layer 25a which is further connected to a polycrystalline silicon layer $18_1$ connected to one end of the fuse element 17 through the contact hole $26_1$ provided through inter-insulation layer 21. Further, a first aluminium interconnection layer 28 is provided. The interconnection layer 28 is connected to a polycrystalline silicon layer $18_2$ connected to the other end of the fuse element 17 through a contact hole $26_2$ provided through the inter-insulation layer 21, and is also connected to a first guard ring region 19 of p+ type through the contact holes $27_1$ to $27_7$. A voltage with the opposite polarity to that of a voltage applied to the substrate 11, that is, a reverse bias voltage (ground potential in the embodiment), is applied to the first aluminium interconnection layer 28. A second aluminium interconnection layer 30 applied with a voltage with a positive polarity is coupled with a second guard ring region 20 through a contact hole 29 provided through the inter-insulation layer 21.

In FIGS. 2A and 2B, in order to melt the fuse element 17 with excessive current flow, a negative terminal of a power source E (5 V for example) is grounded and a ground potential of 0 V is applied to the polycrystalline silicon layer $18_2$ through the first aluminium interconnection layer 28. Additionally, a voltage with a positive polarity is applied from the power source E to the source takeout aluminium interconnection layer 23, and a voltage of approximately −15 V is applied to the gate electrode 16 of the p channel MOS transistor. In this case, if the channel width and the channel length of the p channel MOS transistor are 500 μm and 2.5 μm, respectively, a current of approximately 60 mA flows through the source and the drain regions 13 and 14. The source-drain path of the p type MOS transistor is connected to the polysilicon layer $18_1$ coupled with the fuse element 14 through the branched aluminium interconnection layer 25a. Accordingly, approximately 60 mA current flows through the fuse element 17. In this way, the fuse element 17 is blown out.

Figure 1:
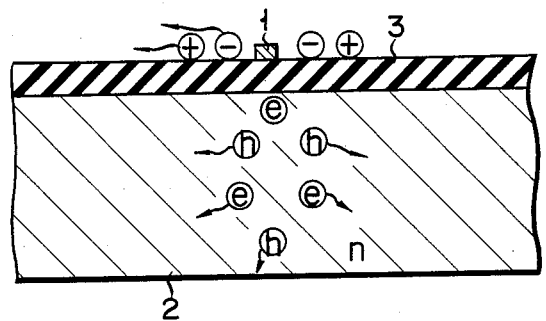
FIG. 1 shows a cross sectional view of a semiconductor device for explaining prior problems when a fuse element included in a semiconductor device is programmed.

The effects resulting from the first and second guard rings 19 and 20 will be described. As illustrated in FIG. 1, pairs of electrons and holes are generated in the substrate when the fuse element is programmed or the fuse element is blown out. Therefore, at this time, the minority carriers, or the holes in this example, of the paired carriers will diffuse into the peripheral circuit provided on the substrate 11. Since the first guard ring 19 is of the opposite conductivity type to that of the substrate and is supplied with an inverse bias voltage at 0 V, the minority carriers, or the holes, are absorbed by the guard ring region 19 and are not diffused into the peripheral circuit located outside the guard ring region 19. A second guard ring region 20, which is of the same n conductivity type as that of the substrate 11 and at a higher concentration than that of the substrate, is further provided surrounding the first guard ring region 19. The resistance of the second guard ring region 20 is lower than that of the substrate.

Accordingly, the current of the majority carriers flows into the second guard ring region 20 and never flows into the substrate region outside the second guard ring region through the substrate regions. The result is to prevent the majority carriers from having an adverse influence on the MOS circuits near the fuse element when the fuse element is programmed. In the present embodiment, a potential difference is set up between the first and the second guard ring regions 19 and 20. Accordingly, positive or negative ions are fixed on or in the inter-insulation layer or the field insulation layer 21 on the first and second guard rings. And, if the MOS circuit is formed near the fuse element 17, the MOS circuit is not influenced by the ions. With such a structure, the above-mentioned disadvantages can be removed.

Figure 3A:
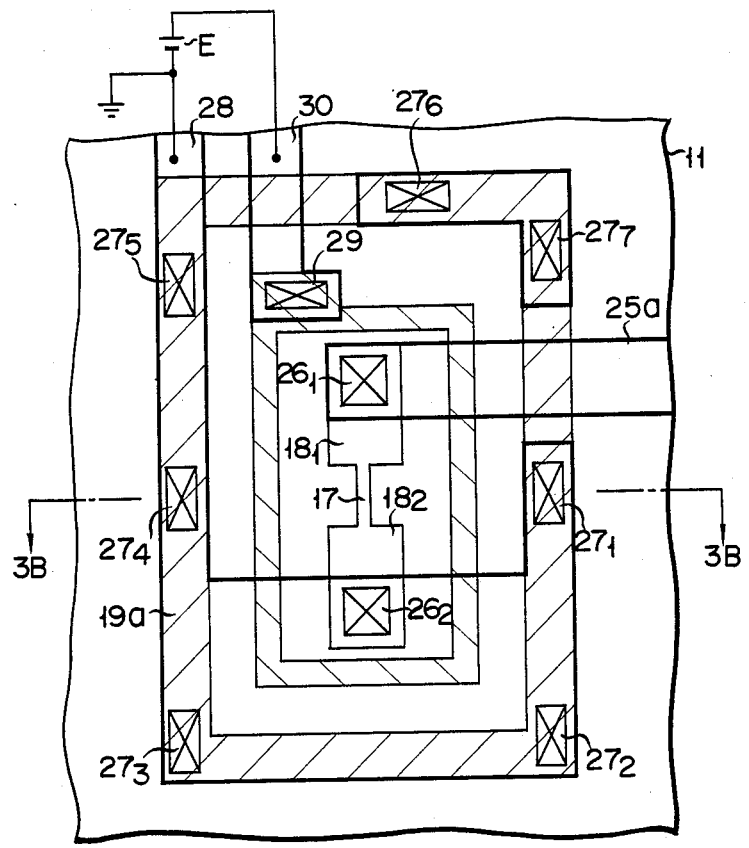
FIG. 3A shows a plan pattern view of another embodiment of a semiconductor device with a fuse element according to the present invention.
Figure 3B:
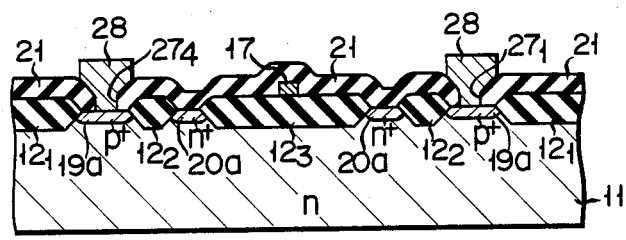
FIG. 3B shows a cross sectional view taken on line 3B—3B.

In the embodiment shown in FIGS. 2A and 2B, the conductivity of the first guard ring region 19 is different from that of the substrate and the second guard ring region 20 is of the same conductivity as that of the substrate 11, as mentioned above. A modification of this arrangement as given below is allowed in the present invention. In the modification, a first guard ring 19a of p+ conductivity type, which is different from that of the substrate 11, is disposed at the outside and a second guard ring region 20a, which is of the same conductivity type as that of the substrate 11 is disposed at the inner side. This construction, which is shown in FIGS. 3A and 3B, has the same effects as those described above.

In the above-mentioned embodiments, the present invention is applied for the programming method in which the fuse element 17 is melted or blown out with an excessive current flow, i.e. the current-melting programming method. It is evident that the present invention is applicable for other programming methods, such as the laser melting method, the current shortcircuiting method, and the laser shortcircuiting method. The conductivity of the substrate 11 may be changed from n type to p type. In this case, the conductivity type of the other semiconductor regions are, of course, correspondingly changed.

Figure 4A:
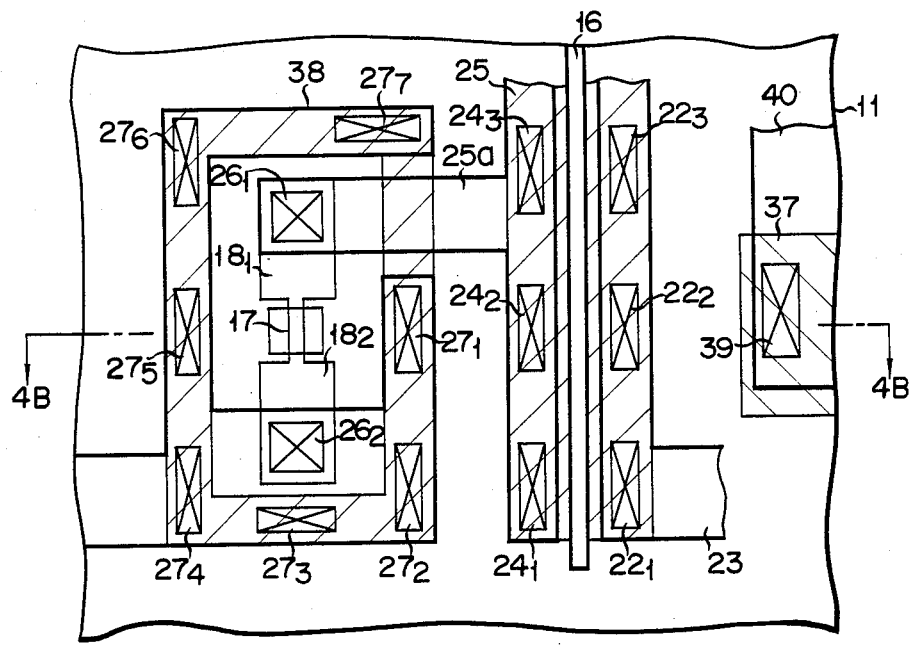
FIG. 4A shows a plan pattern view of a part of yet another embodiment of a semiconductor device with a fuse element according to the present invention.
Figure 4B:
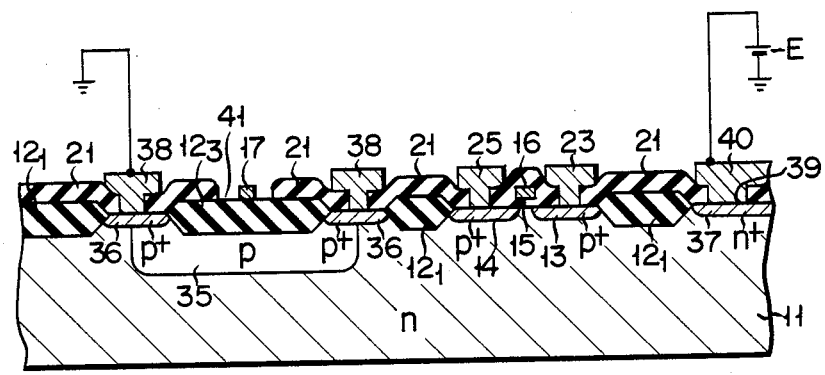
FIG. 4B shows a cross sectional view taken on line 4B—4B in FIG. 4A.

Turning now to FIGS. 4A and 4B, there is shown another embodiment according to the present invention. In the figures, like numerals are used for designating like portions in FIGS. 2A and 2B. In FIGS. 4A and 4B, the substrate 11 contains donor impurity, for example, phosphorus, arsenic or antimony, at $10^{15}$ cm$^{-3}$. Field insulation films $12_1$ and $12_3$ made of silicon oxide of 8000 μm, for example, are formed on the surface of the substrate 11. The three field insulation films $12_1$ are interconnected. The field insulation film $12_3$ is shaped like an island. A p$^+$ type source region 13 and a p$^+$ type drain region 14, which are electrically separated from each other are formed on the surface of an island-like substrate region surrounded by the field insulation films $12_1$ and $12_1$. A gate electrode 16 of polycrystalline silicon of 5000 Å in thickness and 15 ohms-cm of sheet resistance is provided on the substrate region between the source region 13 and the drain region 14, through a gate insulation film 15 of silicon oxide of 500 Å thickness. The source region 13, the drain region 14, the gate insulation film 15 and the gate electrode 16 make up a p channel MOS transistor. A fuse element 17 of polycrystalline silicon 2 μm in width and 6 μm in length, for example, is formed on the island field insulation film $12_3$. The fuse element 17 is coupled at both ends with polycrystalline silicon layers $18_1$ and $18_2$ wider than the fuse element 17. The fuse element 17, the polycrystalline silicon layers $18_1$ and $18_2$, and the gate electrode 16 are formed in the same step. An impurity region 35 of p type of 8 μm in depth is formed in the substrate region under the island field insulation film $12_3$. The p type impurity region 35 is so designed that its surface region contains acceptor impurity such as boron at a concentration of $10^{16}$ cm$^{-3}$. A p$^+$ type guard ring region 36 containing boron at $10^{20}$ cm$^{-3}$ and of 0.5 μm in depth is formed on the surface of the substrate 11 located around the p type impurity 35. The p$^+$ type guard ring region 36, the p$^+$ source region 13 and the p$^+$ drain region of the MOS transistor are formed in one step. An n$^+$ type region 37 having a surface concentration of $10^{20}$ cm$^{-3}$ and a depth of 0.3 μm is formed on the surface of the substrate 11. An interinsulation layer 21 made of CVD-SiO$_2$ covers the entire surface of the substrate 11 containing the gate electrode 16, the fuse element, and the like. An aluminium interconnection layer 23 for taking out the source by contacting with the p$^+$ type source region 13 through contact holes $22_1$, $22_2$, $22_3$, which are provided through the inter-insulation layer 21, is formed on the inter-insulation layer 21. An aluminium interconnection layer 25 for taking out the drain by contacting with the p$^+$ type drain region 14 through contact holes $24_1$, $24_2$, $24_3$, which are provided through the inter-insulation layer 21, is formed on the inter-insulation layer 21. The Al interconnection layer 25 is connected to a branched aluminium interconnection layer 25a which is further connected to a polycrystalline silicon layer $18_1$ connected to one end of the fuse element 17 through the contact hole $26_1$ provided through the inter-insulation layer 21. Further, an aluminium interconnection layer 38 is further provided and connected to a polycrystalline silicon layer $18_2$ which is also connected to the other end of the fuse element 17 through a contact hole $26_2$ provided through the inter-insulation layer 21. The interconnection layer 38 is also connected to a first guard ring region 36 of p$^+$ type through the contact holes $27_1$ to $27_7$ provided through the inter-insulation layer 21. A voltage with the opposite polarity to that of a voltage applied to the substrate 11, that is, a reverse bias voltage (ground potential in the embodiment), is applied to the p$^+$ type guard ring region 36. A power source line 40 connected at the positive end to the n$^+$ region 37 through a contact hole 39 is formed on the inter-insulation layer 21. A heat radiation window 41 is opened in the inter-insulation layer 21 above the fuse element 17.

In the semiconductor device shown in FIGS. 4A and 4B, for current-melting the fuse element 17, the aluminium interconnection layer 38 connected to the polycrystalline silicon layer $18_2$ at the other end of the fuse element 17 is set at ground potential of 0 V, a 5 V from the power source E is applied to the aluminium interconnection layer 23, and approximately $-15$ V is applied to the gate electrode 16 of the p channel MOS transistor. In this case, if the channel width and the channel length of the p MOS transistor are 500 μm and 2.5 μm, respectively, approximately 60 mA flows between the source region 13 and the drain region 14. As a result, a current of approximately 60 mA flows through the fuse element 17 connected between the polycrystalline silicon layer $18_1$ connected through the contact hole $26_1$ to the branched interconnection layer 25a of the drain takeout aluminium interconnection layer 25 and the polycrystalline silicon layer $18_2$ connected to the aluminium interconnection layer 38. Accordingly, the fuse element 17 is melted away.

When the fuse element 17 is melted away, paired carriers are generated in the silicon substrate 11. The minor carriers, or holes, of the paired carriers will diffuse into the substrate around the fuse element 17. The n type substrate region under the fuse element 17 is separated from the fuse element 17 by the field insulation film $12_3$ and the p type impurity region 35 is biased to ground potential. Accordingly, the minority carriers are absorbed by the p type impurity region 35 and are not diffused into the peripheral circuit formed outside the inpurity region 35.

By the heat generated when the fuse element 17 is melted away, alkaline ions and metal ions trapped in the field insulation film $12_3$ by the getter effect are released and these ions contaminate the insulation film outside the field insulation film $12_3$. A p type inpurity region 35 is provided under the field insulation film $12_3$ and is kept at ground potential through the aluminium interconnection layer 38 connected to the guard ring region 36. Accordingly, the contaminant ions are kept in or on the insulation film on the p type impurity region 35 or in or on the insulation film on the guard ring region 36 and do not diffuse into or onto the insulation film outside the insulation film on the p type impurity region 35 or the guard ring region 36. The effects resulting from this are similar to that of the embodiment of FIGS. 2A and 2B. This implies that the MOS circuit may be formed in the substrate region adjacent to the fuse element 17. As a result, a semiconductor device having a high integration density may be realized and a high reliability of the semiconductor device even after the fuse element is programmed may be secured.

The embodiment shown in FIGS. 4A and 4B is also applicable for the semiconductor device with a fuse element, which employs the laser melting programming method, the current shortcircuit programming method, or the laser shortcircuit programming method, and for the semiconductor device employing the p type silicon substrate.

Figure 5:
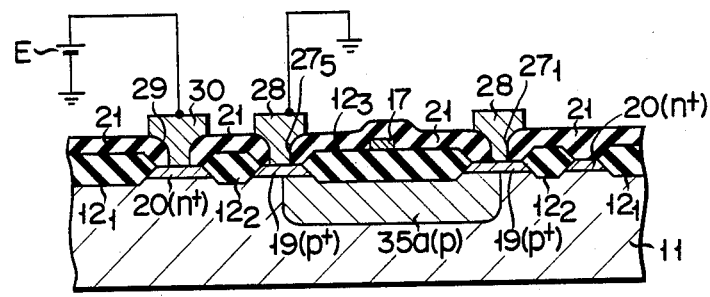
FIG. 5 shows a partial cross sectional view of a further embodiment of a semiconductor device with a fuse element according to the present invention.

FIG. 5 shows yet another embodiment of a semiconductor device with a fuse element according to the present invention. This embodiment is characterized in that a p type impurity region 35a is formed in the n type substrate 11 located under the field insulation film $12_3$ described in the embodiment shown in FIG. 2B. The impurity region 35a is disposed partially in contact with the first guard ring region 19 of p+ type.

Figure 6:
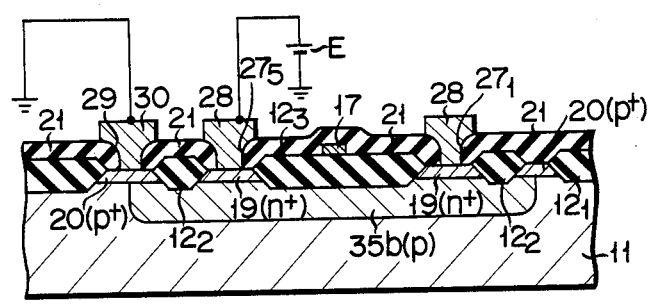
FIG. 6 shows a partial cross sectional view of still another embodiment of a semiconductor device with a fuse element according to the present invention.

An embodiment of a semiconductor device with a fuse element according to the present invention as shown in FIG. 6, is equivalent to the FIG. 2 embodiment modified as given below. The first guard ring region 19 is of n+ type, the second guard ring region 20 is of the p+ type, the positive terminal of the power source E is connected to the first aluminium interconnection layer 28, and the second aluminium interconnection layer 30 is grounded. A p type impurity region 35b is provided in the substrate region under the field insulation film $12_3$, partially in contact with the second guard ring region 20 of p+ type. The FIGS. 5 and 6 embodiment further enhances the effects attained by the FIG. 2 embodiment.

What is claimed is:

1. A semiconductor device comprising:
   a semiconductor substrate of a first conductivity type;
   a metal oxide semiconductor (MOS) transistor formation region in said semiconductor substrate, said MOS transistor formation region having a number of MOS transistors;
   an insulation layer provided on a region of said substrate, said region being located apart from said MOS transistor formation region;
   a fuse element provided on said insulation layer, said fuse element being connected to one of a source and a drain of one of said MOS transistors, said fuse element being destructible whereupon minority and majority carriers are released into said semiconductor substrate;
   a first semiconductor guard ring region of a second coductivity type formed in said semiconductor substrate, said first guard ring region surrounding said insulation layer;
   a second semiconductor guard ring region of said first conductivity type formed in said substrate, said second guard ring region surrounding said first guard ring region and spatially separated from said first guard ring region; and
   means for applying a voltage between said first and second guard ring regions so as to impress a reverse bias voltage between said first semiconductor guard ring region and said semiconductor substrate, said first and second guard ring regions absorbing said minority and majority carriers, respectively, upon destruction of said fuse element.

2. The semiconductor device according to claim 1, wherein said second semiconductor guard ring region has an impurity concentration of at least $10^{18}$ cm$^{-3}$.

3. The semiconductor device according to claim 1, wherein said fuse element is of a current melting type.

4. The semiconductor device according to claim 1, wherein said fuse element is of a laser interrupting type.

5. The semiconductor device according to claim 1, wherein said fuse element is of a laser shortcircuiting type.

6. The semiconductor device according to claim 1, wherein said fuse element is of the same material as a gate electrode material of said MOS transistors in said MOS transistor formation region.

7. The semiconductor device according to claim 1, wherein the thickness of said insulation layer on which said fuse element is formed is greater than that of a gate insulation film of said MOS transistors in said MOS transistor formation region.

8. A semiconductor device comprising:
   a semiconductor substrate of a first conductivity type;
   a metal oxide semiconductor (MOS) transistor formation region in said semiconductor substrate, said MOS transistor formation region having a plurality of MOS transistors;
   a semiconductor well region of a second conductivity type in said substrate, said semiconductor well region being located apart from said MOS transistor formation region;
   an insulation layer provided on said semiconductor well region;
   a fuse element provided on said insulation layer, said fuse element being connected to one of a source and a drain of one of said MOS transistors, said fuse element being destructible whereupon minority and majority carriers are released into said semiconductor substrate;
   a first semiconductor guard ring region of a second conductivity type formed in said well region, said first guard ring region surrounding said insulation layer;
   a second semiconductor guard ring region of said first conductivity type formed in said substrate, said second guard ring region surrounding said first guard ring region and spatially separated from said first guard ring region; and
   means for applying a voltage between said first and second guard ring regions so as to impress a reverse bias voltage between said semiconductor well region and said semiconductor substrate, said first and second guard ring regions absorbing said minority and majority carriers, respectively, upon destruction of said fuse element.

9. A semiconductor device comprising:
   a semiconductor substrate of a first conductivity type;
   a metal oxide semiconductor (MOS) transistor formation region in said substrate, said MOS transistor formation region having a plurality of MOS transistors;
   a semiconductor well region of a second conductivity type formed in said substrate, said semiconductor well region being located apart from said MOS transistor formation region;
   an insulation layer provided on said semiconductor well region;

a fuse element provided on said insulation layer, said fuse element being connected to one of a source and a drain of one of said MOS transistors, said fuse element being destructible whereupon minority and majority carriers are released into said semiconductor substrate;

a first semiconductor guard ring region of said first conductivity type formed in said semiconductor well region, said first guard ring region surrounding said insulation layer;

a second semiconductor guard ring region of a second conductivity type formed in said well region, said second guard ring region surrounding said first guard ring region and spatially separated from said first guard ring region; and means for applying a voltage between said first and second guard ring regions so as to impress a reverse bias voltage between said semiconductor well region and said first guard ring region, said first and second guard ring regions absorbing said minority and majority carriers, respectively, upon destruction of said fuse element.

* * * * *